United States Patent
Roy

(10) Patent No.: US 8,716,760 B2
(45) Date of Patent: May 6, 2014

(54) PHOTOSENSITIVE CHARGE-COUPLED DEVICE COMPRISING VERTICAL ELECTRODES

(75) Inventor: François Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 728 days.

(21) Appl. No.: 12/821,820

(22) Filed: Jun. 23, 2010

(65) Prior Publication Data

US 2010/0327327 A1    Dec. 30, 2010

(30) Foreign Application Priority Data

Jun. 24, 2009    (FR) ...................................... 09 54294

(51) Int. Cl.
*H01L 29/80*    (2006.01)

(52) U.S. Cl.
USPC ....... 257/215; 257/225; 257/248; 257/E27.15

(58) Field of Classification Search
USPC ......... 257/215, 225, 226, 242, 244, 246, 248, 257/330, E27.15
See application file for complete search history.

(56) References Cited

U.S. PATENT DOCUMENTS

| | | | |
|---|---|---|---|
| 4,926,225 | A | 5/1990 | Hosack |
| 5,029,321 | A | 7/1991 | Kimura |
| 5,055,900 | A | 10/1991 | Fossum et al. |

FOREIGN PATENT DOCUMENTS

| | | |
|---|---|---|
| EP | 0 418 500 A2 | 3/1991 |
| JP | 56013769 A | 2/1981 |
| JP | 04045548 A | 2/1992 |

OTHER PUBLICATIONS

French Search Report dated Jan. 15, 2010 from corresponding French Application No. 09/54294.
French Search Report dated Jan. 15, 2010 from related French Application No. 09/54295.
French Search Report dated Jan. 15, 2010 from related French Application No. 09/54296.

*Primary Examiner* — Jack Chen
(74) *Attorney, Agent, or Firm* — Wolf, Greenfield & Sacks, P.C.

(57) ABSTRACT

A charge transfer device formed in a semiconductor substrate and including an array of electrodes forming rows and columns, wherein: the electrodes extend, in rows, in successive grooves with insulated walls, disposed in the substrate thickness and parallel to the charge transfer direction.

15 Claims, 3 Drawing Sheets

PHOTOSENSITIVE CHARGE-COUPLED DEVICE COMPRISING VERTICAL ELECTRODES

CROSS REFERENCE TO RELATED APPLICATIONS

This application claims the priority benefit of French patent application Ser. No. 09/54294, filed on Jun. 24, 2009, entitled "PHOTOSENSITIVE CHARGE-COUPLED DEVICE COMPRISING VERTICAL ELECTRODES," which is hereby incorporated by reference to the maximum extent allowable by law.

BACKGROUND OF THE INVENTION

1. Field of the Invention

The present invention relates to charge-coupled devices or CCDs. It more specifically aims at a two-phase CCD array device. A preferred application to a CCD image sensor will be described hereafter, it being understood that the present invention may apply to any type of CCD.

2. Discussion of the Related Art

FIGS. 1A to 1C schematically show a portion of a four-phase charge-coupled image sensor. FIG. 1A is a top view, FIG. 1B is a cross-section view along plane B-B of FIG. 1A, and FIG. 1C is a cross-section view along plane C-C of FIG. 1A.

An N-type doped layer 3 is arranged on a P-type doped silicon substrate 1. Substrate 1 and layer 3 form the photoconversion area of the sensor. The upper portion of the photoconversion area is divided into a plurality of lines 5 separated by insulation rows 7, for example, formed of trenches filled with oxide. Columns of insulated electrodes 9, for example, made of polysilicon, equidistant, and perpendicular to lines 5 are arranged above layer 3. A thin oxide layer 11 deposited at the surface of layer 3 insulates electrodes 9 from layer 3. Electrodes 9, properly biased, define in each line 5 a succession of potential wells where electric charges can be stored. In the shown example, a pixel is defined in each line by four successive electrodes G1 to G4. The potential well corresponding to such a pixel is created by application of a high voltage, for example, on the order of 5 V, to electrodes G2 and G3, and of a low voltage, lower than the high voltage, for example, on the order of 0 V, to electrodes G1 and G4.

During an image acquisition period, the sensor is illuminated and electrons resulting from the creation, by absorption of a photon, of an electron-hole pair in the photoconversion area are stored in the potential wells which fill up proportionally to the illumination of the corresponding pixel. The illumination light needs to cross electrodes 9 and insulation layer 11. The thickness of the active region of the sensor, essentially formed by substrate 1 and layer 3, is sufficient to absorb the photons, whatever their wavelengths in the desired spectrum.

After the acquisition period, a transfer period is provided during which the charges stored in the potential wells are transferred in the direction indicated by arrows 13, in parallel for the plurality of columns and in series for the pixels of a same line 5, towards read and/or storage circuits. The charge shifting is ensured by successive modifications of the voltages applied to the electrodes.

FIG. 2 schematically illustrates a simple four-phase mode of transfer of the charges from one well to an adjacent well by switching, between high and low states, of voltages Φ1, Φ2, Φ3, Φ4 applied to electrodes G1, G2, G3, G4 of each pixel.

At a time t0 corresponding to the end of an image acquisition period, charges, shown by the hatched areas of the drawings, are stored in the potential wells formed by application of a high voltage on electrodes G2 and G3 and of a low voltage on electrodes G1 and G4.

At a time t0+T, T being the period of the clock driving the charge transfer, the voltages applied to electrodes G2 and G4 are switched. Thus, the shifting of the potential wells causes the synchronized shifting of the charge packets to the right. To ease the transfer, electrode G4 will be set to the high voltage before electrode G2 is set to the low voltage.

At a time t0+2T, the voltages applied to electrodes G1 to G3 are switched. At a time t0+3T, the voltages applied to electrodes G2 and G4 are switched. Finally, at a time t0+4T, the voltages applied to electrodes G1 and G3 are switched. Thus, at the fourth clock period after time t0, the charges stored in a potential well under a pixel have been shifted towards a potential well under an adjacent pixel of the same line. At the sensor output, the shifted charge packets may be converted into electric voltages by adapted circuits, to form an image signal.

Of course, the transfer period is short as compared with the acquisition period. As an example, the acquisition period is on the order of from 20 to 50 ms and the electrode switching clock frequency may be greater than 2 MHz, which provides a transfer time shorter than 2 ms for a line of 1,000 pixels and a shifting in four phases.

To decrease the transfer period, a shifting in three phases may be implemented.

A disadvantage of the described CCD is that the light needs to cross the polysilicon transfer control electrodes. Part of the photons are thus absorbed in the electrodes, which decreases the sensor sensitivity, especially in the blue range. Indeed, blue photons are absorbed over a short distance while red photons penetrate deeper into the silicon. To overcome this disadvantage, the transfer electrodes may be arranged next to the photoconversion region rather than above it. However, this solution has the disadvantage of increasing the bulk for a given size of the photoconversion region.

Another disadvantage of this type of sensor lies in the fact that the charge storage capacity associated with each pixel is limited by the electrode surface area and by possible carrier recombinations.

SUMMARY OF THE INVENTION

An object of an embodiment of the present invention is to overcome all or part of the disadvantages of conventional charge-coupled devices.

An object of an embodiment of the present invention is to provide a sensor structure of improved sensitivity and of low bulk.

An object of an embodiment of the present invention is to provide such a sensor which is easy to form.

Thus, an embodiment of the present invention provides a charge transfer device formed in a semiconductor substrate and comprising an array of electrodes forming rows and columns, wherein: the electrodes extend, in rows, in successive grooves with insulated walls, disposed in the substrate thickness and parallel to the charge transfer direction.

Another embodiment of the present invention provides an image sensor comprising a charge transfer device such as mentioned hereabove, capable of receiving a visible radiation.

According to an embodiment of the present invention, an image element corresponds to the interval between four successive electrodes of a row and four successive opposite electrodes of an adjacent row.

According to an embodiment of the present invention, the electrodes of a same column are interconnected and are capable of receiving shifting signals in four phases.

According to an embodiment of the present invention, an image element corresponds to the interval between three successive electrodes of a row and three successive opposite electrodes of an adjacent row.

According to an embodiment of the present invention, the electrodes of the same column are interconnected and are capable of receiving shifting signals in three phases.

According to an embodiment of the present invention, the upper substrate portion comprises a first doped semiconductor layer of a first conductivity type of a first doping level, and a second doped semiconductor layer of a second conductivity type, covering the first layer.

According to an embodiment of the present invention, a third doped semiconductor of the first conductivity type, of a doping level greater than the first level, covers the second layer.

According to an embodiment of the present invention, the electrodes are made of doped polysilicon.

According to an embodiment of the present invention, an end of each line is connected to a read device capable of converting the charges into an image electric signal.

The foregoing objects, features, and advantages of the present invention will be discussed in detail in the following non-limiting description of specific embodiments in connection with the accompanying drawings.

DETAILED DESCRIPTION

As usual in the representation of integrated circuits, the various drawings are not to scale.

In the sensor described herein, the charge transfer electrodes are arranged vertically, across the depth of the substrate photoconversion area.

Figure 3A:
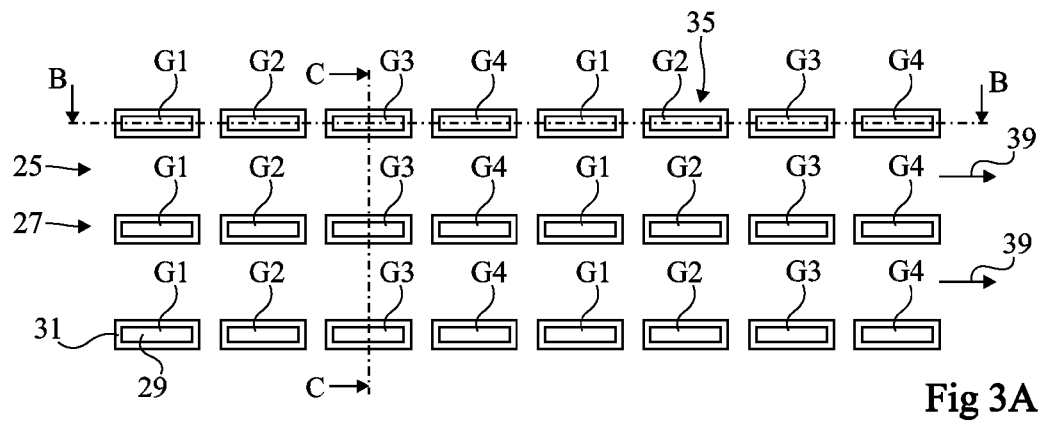
FIG. 3A is a top view schematically showing a portion of a CCD sensor according to an embodiment of the present invention.
Figure 3B:
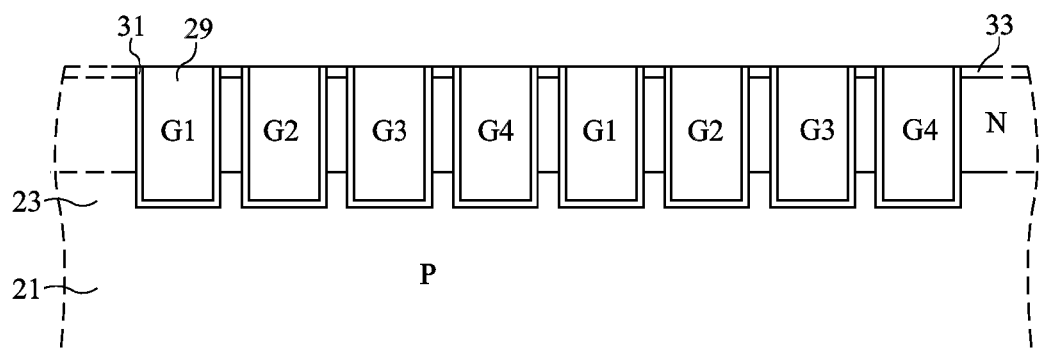
FIG. 3B is a cross-section view along plane B-B of FIG. 3A.
Figure 3C:
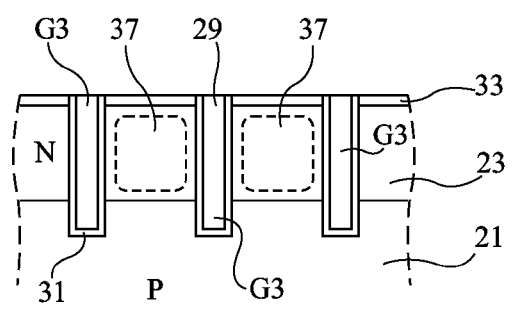
FIG. 3C is a cross-section view along plane C-C of FIG. 3A.

FIGS. 3A to 3C schematically show a portion of a charge-coupled device. FIG. 3A is a top view, FIG. 3B is a cross-section view along plane B-B of FIG. 3A, and FIG. 3C is a cross-section view along plane C-C of FIG. 3A.

Figure 4:
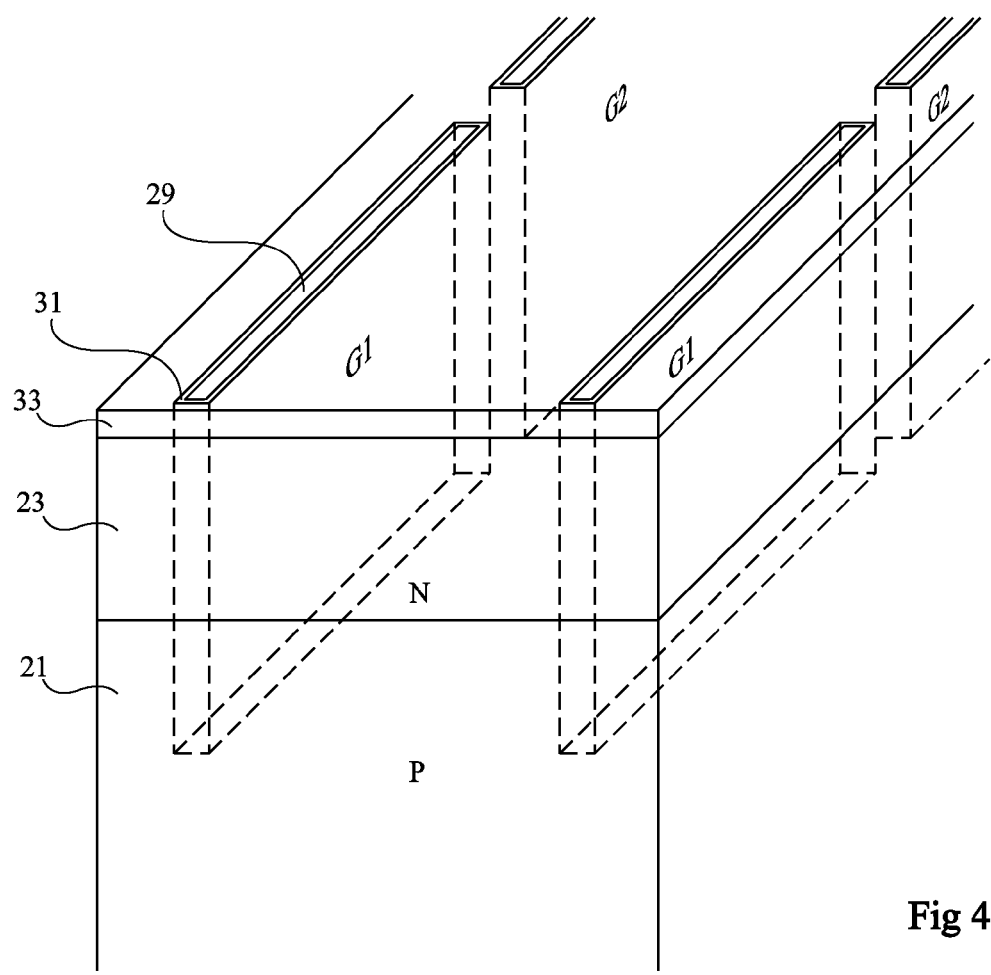
FIG. 4 is a partial perspective view of the sensor of FIGS. 3A to 3C.

FIG. 4 is a perspective view schematically showing a portion of FIGS. 3A to 3C.

An N-type doped layer 23 is arranged on a P-type doped silicon substrate 21. Layer 23 and possibly the upper portion of substrate 21 form the sensor photoconversion area. A thin P-type doped layer 33 is formed at the surface of layer 23. Layer 33 especially has the function of avoiding the presence of an interface between the upper surface of layer 23 and an upper silicon layer (not shown). Indeed, the presence of an interface between layer 23 containing charge carriers and a silicon oxide layer would result in a decrease in the number of carriers by trapping at the interface or in a dark current increase. Another function of layer 33 is to maintain a reference voltage in layer 23. The upper portion of the photoconversion area is divided into a plurality of lines 25 separated by rows 27 of insulated electrodes 29, extending vertically through layers 33, 23, and 21. Each row of electrodes 29 is for example formed of successive aligned parallelepipedal cavities or grooves, filled with doped polysilicon, insulated from the substrate by an oxide layer 31. The electrodes 29 of two adjacent rows 27 are opposite two by two and form electrode columns 35.

Electrodes 29, properly biased, define in each line 25 a succession of potential wells in which electric charges may be stored. In the shown example, a pixel is defined by the region between two successive electrodes G1 to G4 of a first row 27, and the four corresponding electrodes G1 to G4 of a second row 27 adjacent to the first row. The corresponding potential well is created by application of a high voltage, for example, on the order of 5 V, to electrodes G2 and to electrodes G3, and of a low voltage, smaller than the high voltage, for example, on the order of 0 V, to electrodes G1 and to electrodes G4. Any other electrode biasing mode during the acquisition phase may be envisaged. A biasing capable of decreasing dark currents may for example be selected.

In practice, in this example, all the electrodes of a same column 35 are interconnected and are set to a same voltage.

The electrodes need to be arranged properly to avoid possible charge leakages from one pixel line to an adjacent line. It will preferably, for example, be chosen to arrange the electrodes so that the shortest distance between two adjacent electrodes of a same column is greater than the shortest distance between two adjacent electrodes of a same line.

During an image acquisition period, the upper surface of the sensor is illuminated and electrons, originating from the creation, by absorption of a photon, of an electron-hole pair in the photoconversion area, are stored in the potential wells which fill proportionally to the illumination of the corresponding pixel. Substrate 21 is connected, in operation, to a reference voltage, for example, the ground, enabling the flowing of the holes resulting from the photoconversion.

The depth of electrodes 29 is preferably selected to limit video crosstalk phenomena, that is, this depth is preferably equal to the depth of the area in which the incident photons are as a majority capable of creating electron-hole pairs (for example, 9 µm for red).

The electrodes are biased in such a way that the photogenerated to electrons are stored in N-type layer 23, in a volume 37 schematically delimited by dotted lines in FIG. 3C. It should be noted that there is no direct interface between electron storage volume 37 and oxide layer 31 for insulating electrodes 29, and no direct interface with an upper oxide layer, which avoids charge losses at the interface.

To obtain a maximum charge storage capacity between electrodes, the thickness of layer 23 is preferably close to the depth of electrodes 29. Thus, the photoconversion area is essentially formed by N-type layer 23.

Figure 1A:
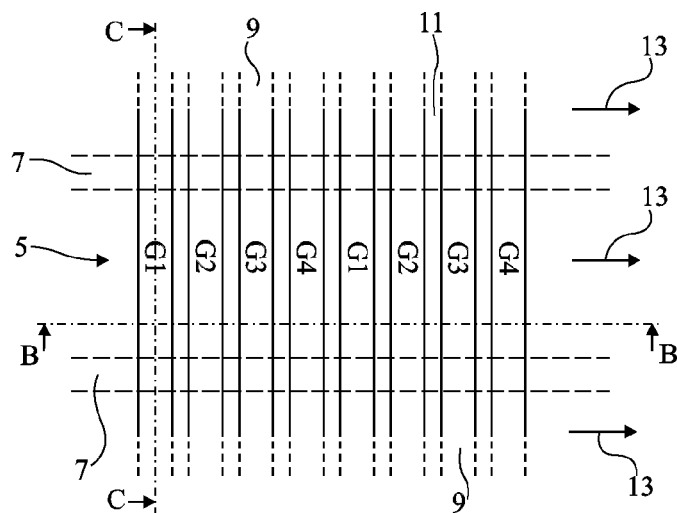
FIG. 1A, previously described, is a top view schematically showing a portion of a CCD sensor.
Figure 1B:
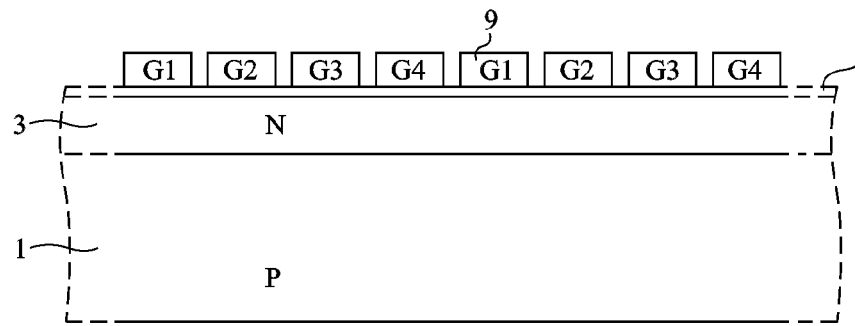
FIG. 1B, previously described, is a cross-section view along plane B-B of FIG. 1A.
Figure 1C:
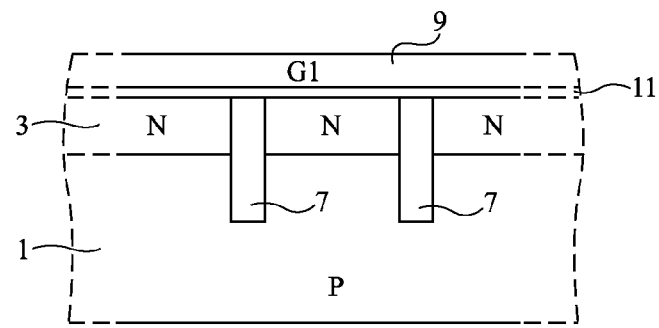
FIG. 1C, previously described, is a cross-section view along plane C-C of FIG. 1A.
Figure 2:
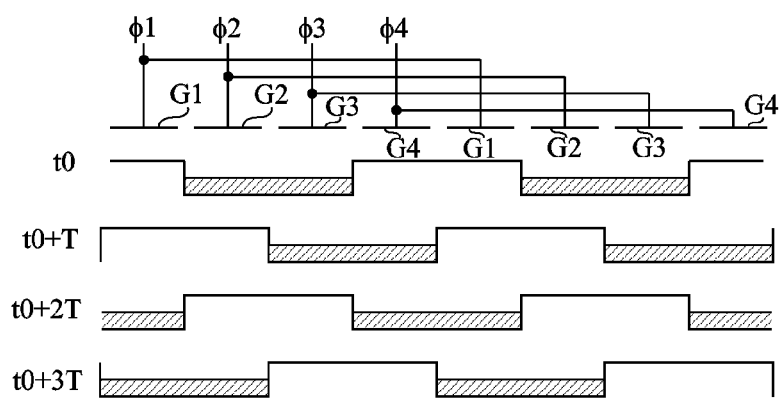
FIG. 2, previously described, schematically illustrates the charge transfer in a four-phase CCD sensor.

After the acquisition period, a transfer period is provided, during which the charges stored in the potential wells are transferred, in the direction of arrows 39, in parallel for the plurality of columns and in series for the pixels of a same line 25, towards read and/or storage circuits. The charge shifting is ensured by successive voltage modifications applied to the electrodes, in four phases, as described in relation with FIG. 2, or in three phases.

An advantage of the described CCD sensor is that it is simple to form. As an example, an N-type doped semiconductor layer is formed by epitaxy on a P-type doped substrate. The upper portion of the N-type layer is P-type doped. Narrow trenches are formed by etching in the substrate. These trenches are insulated from the substrate by an oxide layer, then filled with doped polysilicon forming the electrodes. The upper surface of the electrodes is left free to form an electric contact with the outside.

Another advantage of the described CCD sensor is that the light for illuminating the sensor does not cross the charge transfer control electrodes. The sensitivity of the sensor is thus improved. Further, the provided embodiment does not increase the pixel bulk with respect to prior art solutions.

According to another advantage of the described CCD sensor, the charge storage capacity associated with a pixel is greater than that of prior art solutions for a same pixel surface. Indeed, in the provided embodiment, the dopant concentration and the volume of the N layer of the potential wells are greater than when the electrodes are arranged at the sensor surface. Further, the storage capacity may be adjusted by increasing or decreasing the distance between two electrode rows.

According to another advantage of the described CCD sensor, the voltages implemented for the charge transfer may be decreased with respect to prior art solutions since two adjacent electrodes of the same column cooperate to create the potential wells in the provided embodiment.

Specific embodiments of the present invention have been described. Various alterations and modifications will occur to those skilled in the art. In particular, an embodiment of a front-side illuminated CCD sensor has been discussed hereabove. It will be within the abilities of those skilled in the art to implement the desired operation for a back-side illuminated CCD sensor. Further, it will be within the abilities of those skilled in the art to implement the desired operation by inverting the conductivity types of the semiconductor layers and by accordingly modifying the applied voltages. Doped polysilicon electrodes and silicon oxide insulating regions have further been mentioned in the above description. It will be within the abilities of those skilled in the art to implement the desired operation whatever the type of conductive material used to form the electrodes and whatever the insulating material used to form the insulating regions.

Embodiments of four-phase charge-coupled devices have been described hereabove. However, the present invention does not only apply to image acquisition devices. It will also be within the abilities of those skilled in the art to form a four-phase charge transfer shift register according to an above-discussed embodiment, where the charges are not photogenerated, but injected, for example, upstream of the transfer lines.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A charge transfer device formed in a semiconductor substrate and comprising:
    an array of slab electrodes arranged in rows and columns, said rows corresponding to a charge transfer direction and each row having a plurality of slab electrodes, wherein the slab electrodes extend in grooves with insulated walls into the semiconductor substrate and are oriented with broad faces parallel to the charge transfer direction; and
    charge accumulation and transfer regions defined by pairs of slab electrodes in adjacent rows, wherein a charge accumulation and transfer region comprises a single volume delimited by a pair of electrodes of a same column in an N-type layer having a thickness substantially equal to a depth of the slab electrodes.

2. An image sensor comprising the charge transfer device of claim 1, configured to receive visible radiation.

3. The sensor of claim 2, wherein an image element corresponds to an interval between four successive electrodes of a row and four successive opposite electrodes of an adjacent row.

4. The sensor of claim 3, wherein:
    slab electrodes of a same column are interconnected and are configured to receive charge-shifting signals in four phases.

5. The sensor of claim 2, wherein an image element corresponds to an interval between three successive electrodes of a row and three successive opposite electrodes of an adjacent row.

6. The sensor of claim 5, wherein slab electrodes of a same column are interconnected and are configured to receive charge-shifting signals in three phases.

7. The sensor of claim 2, wherein an upper semiconductor substrate portion comprises a first doped semiconductor layer of a first conductivity type of a first doping level, and a second doped semiconductor layer of a second conductivity type, covering the first doped semiconductor layer.

8. The sensor of claim 7, wherein a third doped semiconductor layer of the first conductivity type, of a doping level greater than the first level, covers the second doped semiconductor layer.

9. The sensor of claim 2, wherein the slab electrodes are made of doped polysilicon.

10. The sensor of claim 3, wherein an end of a row of image elements is connected to a read device capable of converting the charges into an image electric signal.

11. The charge transfer device of claim 1, further comprising a P-type layer formed over the N-type layer.

12. The charge transfer device of claim 1, wherein the charge accumulation and transfer region comprises a region in which photoelectrons are generated when illuminated by radiation.

13. The charge transfer device of claim 12, wherein a depth of the slab electrodes is approximately 9 microns.

14. The charge transfer device of claim 1, wherein the slab electrodes are insulated from the substrate by an oxide layer.

15. The sensor of claim 5, wherein an end of a row of image elements is connected to a read device capable of converting the charges into an image electric signal.

* * * * *

UNITED STATES PATENT AND TRADEMARK OFFICE
CERTIFICATE OF CORRECTION

PATENT NO. : 8,716,760 B2  
APPLICATION NO. : 12/821820  
DATED : May 6, 2014  
INVENTOR(S) : François Roy Page 1 of 1

It is certified that error appears in the above-identified patent and that said Letters Patent is hereby corrected as shown below:

\*\*In the Specification:

Column 4, line 53, the word "to" in the sentence should be deleted.\*\*

Signed and Sealed this  
First Day of July, 2014

Michelle K. Lee  
*Deputy Director of the United States Patent and Trademark Office*